United States Patent
Wang et al.

(10) Patent No.: US 7,445,726 B2
(45) Date of Patent: Nov. 4, 2008

(54) PHOTORESIST TRIMMING PROCESS

(75) Inventors: Kevin C K Wang, Tainan County (TW); Jiunn-Hsiung Liao, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/162,271

(22) Filed: Sep. 5, 2005

(65) Prior Publication Data

US 2007/0051698 A1    Mar. 8, 2007

(51) Int. Cl.
 *C03C 15/00* (2006.01)
(52) U.S. Cl. .......................... 216/67; 156/345; 216/16; 216/59; 438/694; 438/706; 438/710; 438/712

(58) Field of Classification Search ................. 156/345; 216/16; 438/706
See application file for complete search history.

(56) References Cited

U.S. PATENT DOCUMENTS

| | | | | |
|---|---|---|---|---|
| 4,825,808 A | * | 5/1989 | Takahashi et al. | 118/719 |
| 5,863,376 A | * | 1/1999 | Wicker et al. | 156/345.38 |
| 2004/0244912 A1 | * | 12/2004 | Tezuka et al. | 156/345.24 |

* cited by examiner

*Primary Examiner*—Nadine Norton
*Assistant Examiner*—Maki Angadi
(74) *Attorney, Agent, or Firm*—Jianq Chyun IP Office

(57) ABSTRACT

A photoresist trimming process is described. An etcher equipped with an etching chamber, a wafer holder, a TCP source and a TCP window is provided. After plasma is generated in the etching chamber, the etching chamber is heated without a wafer therein, and the temperature at the TCP window is monitored simultaneously. It is started, at any time after the temperature at the TCP window reaches a predetermined one, to treat wafers with photoresist layers to be trimmed thereon through the etching chamber.

10 Claims, 1 Drawing Sheet

PHOTORESIST TRIMMING PROCESS

BACKGROUND OF THE INVENTION

1. Field of the Invention

The present invention relates to a semiconductor process. More particularly, the present invention relates to a photoresist trimming process that is conducted to reduce the linewidth of photoresist patterns formed on semiconductor wafers.

2. Description of the Related Art

In advanced semiconductor processes, a narrower linewidth of a patterned wafer layer can be made by trimming the photoresist patterns for defining the wafer layer prior to the corresponding etching step of the wafer layer. A photoresist trimming process can be conducted in a transformer coupled plasma (TCP) etcher, which usually includes an electrostatic chuck for holding a wafer, a thermometer on the electrostatic chuck for measuring the temperature in the etching chamber, and a TCP window of dielectric material in the etching chamber that allows RF power to be transmitted to the plasma generation zone of the etching chamber.

However, in a conventional photoresist trimming process, many season wafers, approximately in a number up to 25, must be treated sequentially through the etching chamber before the target wafers are treated, so that the degree of photoresist trimming on the target wafers can be kept stable to ensure uniformity of critical dimension (CD). Accordingly, many wafers are wasted as season wafers in a conventional photoresist trimming process, so that the manufacturing cost of the product is increased.

SUMMARY OF THE INVENTION

In view of the foregoing, the inventors have inspected the reason why the degree of photoresist trimming on the target wafers can be stable after many season wafers are used, and found that the key point is the accuracy of temperature measurement in the etching chamber.

Specifically, in the initial stage of a photoresist trimming process, the effective temperature in the etching chamber increases more slowly than the temperature measured at the electrostatic chuck, which is rapidly increased to a predetermined working temperature and maintained thereat. Hence, the season wafers are actually treated at continuously varying temperature below the working temperature. After the season wafers are used, i.e., after the initial stage of the process, the effective temperature in the etching chamber catches up with the temperature at the electrostatic chuck and then fixes at the predetermined working temperature. Therefore, the degree of photoresist trimming on the target wafers can be stable.

Based on the above discovery, this invention provides a photoresist trimming process capable of preventing waste of season wafers, wherein the temperature at the TCP window is monitored to reflect the effective temperature in the etching chamber more accurately.

This invention also provides an etcher for trimming photoresist that is capable of preventing waste of season wafers, wherein a temperature measuring means is disposed at the TCP window to measure the effective temperature in the etching chamber more accurately.

The photoresist trimming process of this invention is described as follows. An etcher equipped with an etching chamber, a wafer holder, a TCP source and a TCP window is provided. After plasma is generated in the etching chamber, the etching chamber is heated without a wafer therein, and the temperature at the TCP window is monitored simultaneously. Thereafter, it is started, at any time after the temperature at the TCP window reaches a predetermined one, to treat wafers with photoresist layers to be trimmed thereon through the etching chamber.

In a preferred embodiment of this invention, the predetermined temperature is allowed to be lower than the working temperature of the photoresist trimming process by certain degrees.

Moreover, the etcher for trimming photoresist of this invention includes an etching chamber, a wafer holder in the etching chamber, a TCP source for generating plasma, a TCP window in the etching chamber, a temperature regulator for controlling the temperature in the etching chamber, and a temperature measuring means disposed at the TCP window.

According to one preferred embodiment, the above temperature measuring means may include a thermal couple. The above temperature regulator may have a feedback mechanism, which decides to heat or cool the etching chamber according to the output of the temperature measuring means for maintaining the temperature in the etching chamber at the working temperature.

Because the temperature at the TCP window, which more accurately reflects the effective temperature in the etching chamber, is monitored to determine the time point after which the target wafers can be treated through the etching chamber, no season wafer is necessary. Therefore, many wafers can be saved to reduce the cost.

It is to be understood that both the foregoing general description and the following detailed description are exemplary, and are intended to provide further explanation of the invention as claimed.

DESCRIPTION OF THE PREFERRED EMBODIMENTS

Figure 1:
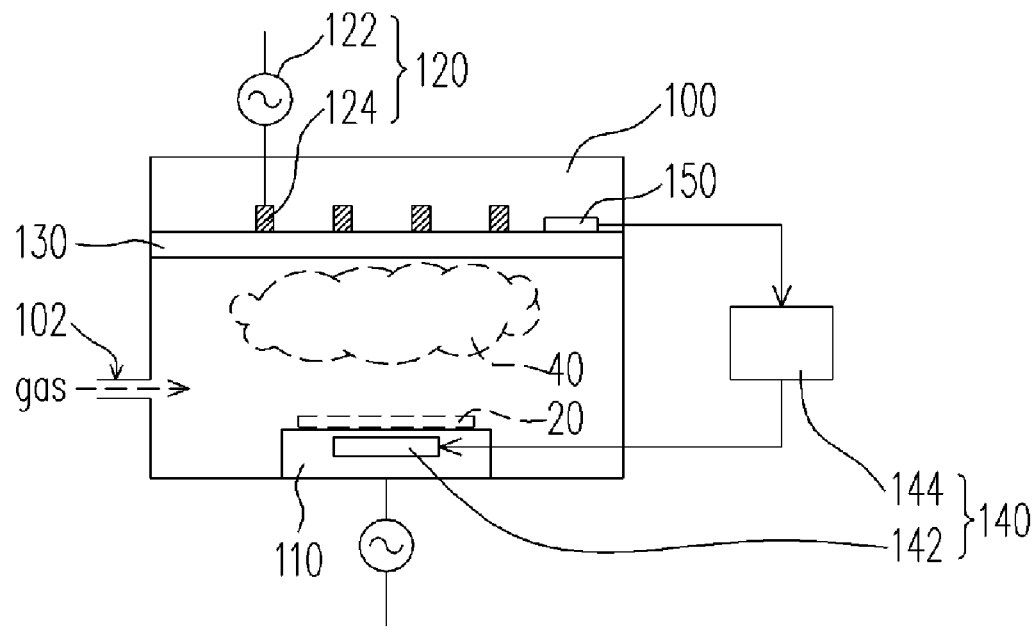
FIG. 1 illustrates an etcher for trimming photoresist according to a preferred embodiment of this invention.

FIG. 1 illustrates an etcher for trimming photoresist according to the preferred embodiment of this invention. The etcher includes an etching chamber 100, a wafer holder 110 in the etching chamber 100 for holding a wafer 20, a TCP source 120 for generating plasma 40, a TCP window 130 in the etching chamber 100, a temperature regulator 140 for controlling the temperature in the etching chamber 100, and a temperature measuring means 150 disposed at the TCP window 130.

The etching chamber 100 has a gas inlet 102 thereon for introducing gas to generate the plasma 40, wherein the gas is typically based on O2. The gas outlet of the etching chamber connected to a vacuum pump is well known, and is therefore not shown in the figure. The wafer holder 110 may include an electrostatic chuck, for example, and the TCP source 120 includes a radio-frequency (RF) power source 122 and a coil 124 disposed over the wafer holder 110. The TCP window 130 is made from a dielectric material like SiC or alumina, and is disposed between the coil 124 and the wafer holder 110 allowing the RF power to be transmitted to the plasma generating zone in the etching chamber 100.

The temperature measuring means 150 includes, for example, a thermal couple that essentially consists two wires of different metal materials with a junction between them, wherein the voltage across the junction varies with the temperature so that the temperature can be decided from the voltage output of the thermal couple.

The temperature regulator 140 usually has a feedback mechanism to effectively maintain the temperature in the etching chamber 100 at the working temperature. The feedback mechanism can be formed by, for example, including a heating/cooling member part 142 and a control unit 144 in the temperature regulator 140 and connecting the output of the temperature measuring means 150 to the temperature regulator 140. The control unit 144 is connected between the temperature measuring means 150 and the heating/cooling member part 142, capable of controlling the member part 142 to heat or cool the etching chamber according to the output of the temperature measuring means 150 for maintaining the working temperature.

Figure 2:
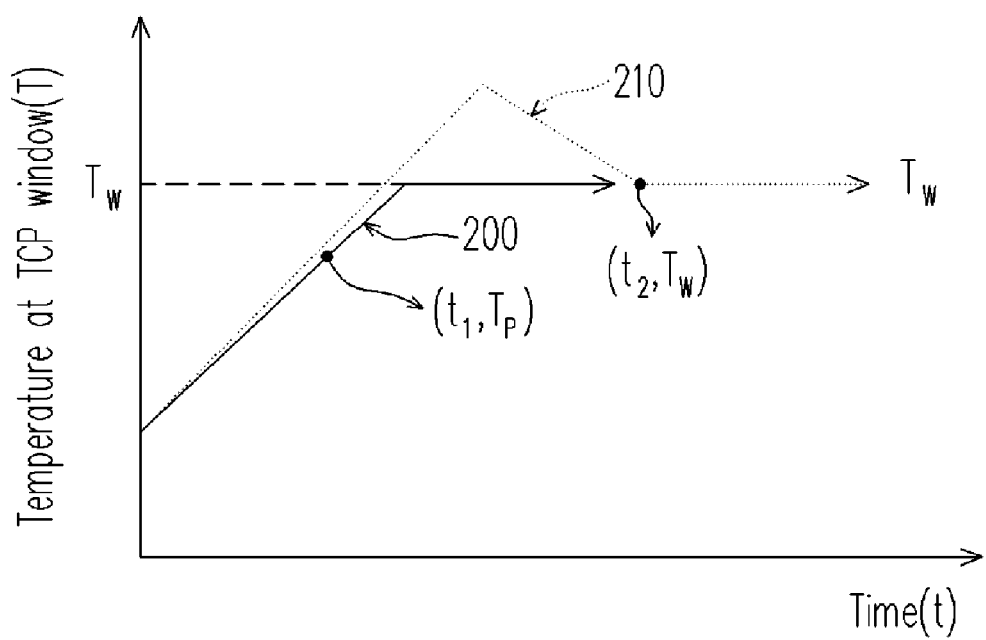
FIG. 2 illustrates the temperature profiles in two photoresist trimming processes respectively according to a first and a second embodiments of this invention, wherein the temperature is measured at the TCP window.

Referring to FIG. 2, the temperature profile in the photoresist trimming process according to the first embodiment of this invention is labeled with 200, wherein the temperature is measured at the TCP window as above.

In the first embodiment, after the reaction gas is introduced and the TCP source is turned on to generate plasma, the etching chamber is heated without any wafer therein. The reaction gas is typically based on O2, and the RF power for generating the plasma may be 50 Watts. The temperature at the TCP window is raised continuously by heating the etching chamber until the working temperature "TW" is reached, and then the temperature is maintained at TW to the end of the photoresist trimming process, wherein the working temperature is preferably about 109° C. In addition, the temperature at the TCP window can be monitored using a thermal couple disposed at the TCP window, and the temperature profile may be made with a temperature regulator having a feedback mechanism as mentioned above to maintain the temperature at the TCP window constantly at TW.

The first one of the target wafers having patterned photoresist layers to be trimmed thereon can be loaded into the etching chamber at any time after the time point (t1) when the temperature at the TCP window reaches a predetermined one (TP), wherein TP is preferably lower than TW by no more than about 30° C. TP is selected such that even if the first target wafer is loaded into the etching chamber immediately after t1, the difference of "the degree of photoresist trimming" on the first target wafer from that on the later target wafers is within a tolerable range. In other words, TP should be selected such that after the trimming process, the difference of "the CD of photoresist pattern" on the first target wafer from that on the later target wafers is within a tolerable range.

Referring to FIG. 2 again, the temperature profile in the photoresist trimming process according to the second embodiment of this invention is plotted in dotted line and labeled with 210, wherein the temperature is also measured at the TCP window.

In the second embodiment, after plasma is generated in the etching chamber, the temperature in the etching chamber as represented by the temperature measured at the TCP window is raised to a temperature higher than the working temperature (TW), lowered to TW, and then maintained at TW to the end of the trimming process, wherein TW is higher than TP of the first embodiment. That is, the etching chamber is overheated and then cooled to TW, and is then maintained at TW. The first target wafer can be loaded into the etching chamber at any time after the time point (t2) when the temperature at the TCP window is lowered to TW. This overheating operation is for ensuring that all parts, especially the parts where the trimming reaction occurs, in the etching chamber are at the predetermined working temperature.

According to the above embodiments of this invention, since the temperature at the TCP window is monitored to determine the time point after which the target wafers can be treated through the etching chamber, no season wafer is necessary. Therefore, many wafers can be saved to reduce the manufacturing cost.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A photoresist trimming process, comprising:
   providing an etcher equipped with an etching chamber, a wafer holder, a transformer coupled plasma (TCP) source and a TCP window;
   generating plasma in the etching chamber;
   heating the etching chamber without a wafer therein and monitoring temperature at the TCP window; and
   starting, at any time after the temperature at the TCP window reaches a predetermined temperature and plasma is generated, to load a wafer with the photoresist layer to be trimmed thereon into the etching chamber and treat the wafer through the etching chamber.

2. The photoresist trimming process of claim 1, wherein the predetermined temperature is lower than a working temperature of the photoresist trimming process that is maintained to end of the photoresist trimming process.

3. The photoresist trimming process of claim 2, wherein the predetermined temperature is lower than the working temperature by about 30° C.

4. The photoresist trimming process of claim 2, wherein the working temperature is about 109° C.

5. The photoresist trimming process of claim 2, wherein the temperature at the TCP window is controlled using a temperature regulator with a feedback mechanism.

6. The photoresist trimming process of claim 1, further comprising the following steps before the wafers are treat through the etching chamber:
   overheating the etching chamber to make the temperature at the TCP window higher than a working temperature of the photoresist trimming process, wherein the working temperature is higher than the predetermined temperature and is maintained to end of the photoresist trimming process; and
   cooling the etching chamber to the working temperature.

7. The photoresist trimming process of claim 6, wherein the working temperature is about 109° C.

8. The photoresist trimming process of claim 6, wherein the temperature at the TCP window is controlled using a temperature regulator with a feedback mechanism.

9. The photoresist trimming process of claim 1, wherein the temperature at the TCP window is monitored using a thermal couple disposed at the TCP window.

10. The photoresist trimming process of claim 1, wherein the wafer holder comprises an electrostatic chuck.

* * * * *